(12) United States Patent
Huang et al.

(10) Patent No.: US 7,141,830 B2
(45) Date of Patent: Nov. 28, 2006

(54) SEMICONDUCTOR LIGHT EMITTING DEVICE AND METHOD OF MAKING THE SAME

(75) Inventors: Pao-I Huang, Chiayi (TW);
Chuan-Cheng Tu, Taipei (TW);
Jen-Chau Wu, Hsinchu (TW)

(73) Assignee: Mediatek, Incorporated, Hsin-Chu (TW)

( * ) Notice: Subject to any disclaimer, the term of this patent is extended or adjusted under 35 U.S.C. 154(b) by 37 days.

(21) Appl. No.: 10/942,697

(22) Filed: Sep. 16, 2004

(65) Prior Publication Data

US 2005/0247952 A1    Nov. 10, 2005

(30) Foreign Application Priority Data

May 7, 2004    (TW) ............... 93113014 A

(51) Int. Cl.
*H01L 29/24* (2006.01)
(52) U.S. Cl. ........................ 257/103; 257/96
(58) Field of Classification Search ........... 257/103, 257/99, 96
See application file for complete search history.

(56) References Cited

U.S. PATENT DOCUMENTS

| | | | |
|---|---|---|---|
| 5,925,897 A | 7/1999 | Oberman | |
| 5,977,566 A | 11/1999 | Okazaki et al. | |
| 6,078,064 A | 6/2000 | Ming-Jiunn et al. | |
| 6,287,947 B1 | 9/2001 | Ludowise et al. | |
| 6,465,808 B1 | 10/2002 | Lin | |
| 6,479,836 B1 | 11/2002 | Suzuki et al. | |
| 6,635,901 B1 * | 10/2003 | Sawaki et al. | 257/80 |
| 6,657,300 B1 * | 12/2003 | Goetz et al. | 257/745 |

* cited by examiner

*Primary Examiner*—Mark V. Prenty
(74) *Attorney, Agent, or Firm*—Hoffman, Warnick & D'Alessandro, LLC

(57) ABSTRACT

The invention provides a semiconductor light emitting device and the method of making it. The semiconductor light emitting device, according to the invention, includes an undoped $In_xGA_yAl_2N$ film, as an Ohmic layer, formed between a top-most semiconductor material layer and a transparent conductive oxide layer. Since the undoped film as a tunneling layer is very thin ($\leq 20$ angstroms), the electric field across the tunneling layer, under forward bias, will make electron tunneling from valence band to conduction band, and return to the transparent conductive layer, A reasonably low and stable forward voltage of the semiconductor light emitting device according to the invention can be achieved.

6 Claims, 3 Drawing Sheets

200
SEMICONDUCTOR LIGHT EMITTING DEVICE AND METHOD OF MAKING THE SAME

BACKGROUND OF THE INVENTION

1. Field of the Invention

The present invention relates to a semiconductor light emitting device and the method of making it, especially to the semiconductor light emitting device that comprises a strong ohmic layer formed between a top semiconductor material layer and a transparent conductive oxide layer, based on which the semiconductor light emitting device has lower and steadier forward voltage.

2. Description of the Prior Art

The transparent conductive oxides, e.g. ITO, ZnO, InO, ZrO, and so on, have been used for overlaying the semiconductor light emitting device. The main function of the transparent conductive oxide layer (TCOL) overlaying the semiconductor light emitting device is to be a conductive medium layer for current diffusion and light passing to improve the external quantum efficiency of the semiconductor light emitting device.

However, the ohm contact between the transparent conductive oxide layer and the top semiconductor material layer (e.g. P-type GaN layer) is not easy to be achieved, The key point of the technology of how the transparent conductive oxide layer is overlaid depends on how the lower and steadier forward voltage (Vf) is achieved. Several prior arts will be described in the following to show the difficulty in the technology.

In U.S. Pat. No. 5,977,566, Okazaki and others propose adding a metal agent layer between an ITO layer and a P-type GaN contact layer to reduce the offset of the conductive area. The material being used to form the above agent layer comprises Mg, Ni, Au, Zu, and Ti. Accordingly, the forward voltage (Vf) of the semiconductor light emitting device is reduced. Moreover, in U.S. Pat. No. 6,078,064, Ming-Jiunn and others propose using a P-type contact layer with highly doped consistency (more than 5×1018) to be the agent layer. In U.S. Pat. No. 6,479,836, Suzuki and others propose selectively doping P-type carrier with high consistency to form super-lattice (e.g. InGaN/GaN, AlGaN/GaN, or other combinations), so as to obtain lower forward voltage (Vf). Furthermore, somebody also proposes using Ni to be the agent layer and utilizing the difused oxygen in the ITO layer to convert it to a NiO layer, so as to reduce the forward voltage (Vf) of the semiconductor light emitting device.

However, in the above arts utilizing an agent layer, the agent layer itself can absorb the intensity of the light outputted by the semiconductor light emitting device, or else during the operation, the carrier is diffused between the agent layer and the contact layer due to the agent layer having highly doped consistency, so that the forward voltage (Vf) of the semiconductor light emitting device may be very unsteady.

The process, which utilizes the ITO layer as the current diffusion layer to improve the intensity of the light outputted by the semiconductor light emitting device and to further overlay the general Ni/Au transparent conductive layers (TCLs), is well-known in the prior arts. For example, in U.S. Pat. No. 5,925,897, Oberman and others propose forming a very thin Au/Ni composite layer between the ITO layer and the P-type InGaN contact layer. Moreover, in U.S. Pat. No. 6,465,808, Lin and others propose a lattice transparent conductive layer. Because the lattice transparent conductive layer has fewer absorption areas, more light emitted by the semiconductor light emitting device can be outputted. In U.S. Pat. No. 6,287,947, Ludowise proposes forming a plurality of transparent conductive layers between the ITO layer and the P-type GaN contact layer. However, the problem of the above technology is that the reproduction of the forward voltage (Vf) and the luminance (Iv) of the semiconductor light emitting device is worse due to the difference of the surface roughness of the epitaxial wafer or the hydrogen passivation effect.

Although there are many different types of ohm contact layers for performing the function of contacting the ITO layer or the transparent conductive oxide layer, the above ohm contact layers are all N-type or P-type with highly doped consistency. During the process of manufacturing the semiconductor light emitting device, the environment of the process, such as residual oxygen or hydrogen, will easily affect the effect of the ohm contact layer. The forward voltage (Vf) of the semiconductor light emitting device will also experience offset caused by unsteady quality of the ohm contact layer.

Therefore, the objective of the present invention is to provide a strong ohmic layer for a semiconductor light emitting device, so that the semiconductor light emitting device can have a lower and steadier forward voltage.

SUMMARY OF THE INVENTION

According to one preferred embodiment of the present invention the semiconductor light emitting device comprises a semiconductor substrate, a multi-layer structure formed on the semiconductor substrate, an undoped film overlaying the multi-layer structure, and a layer, consisting of a transparent conductive oxide, overlaying the undoped film. The multi-layer structure comprises a light emitting region. The undoped film is formed from $In_xGa_yAl_zN$, wherein $x+y+z=1$, and $0 \leq x,y,z \leq 1$. An operating forward voltage of the semiconductor light emitting device is less than or equal to 3.7 Volts.

According to one preferred embodiment of the present invention, the steps of the method for manufacturing a semiconductor light emitting device are as follows. First, a multi-layer structure is formed on a semiconductor substrate. The multi-layer structure comprises a light emitting region and provides a top semiconductor material layer. Then, an undoped film is formed and overlays the top semiconductor material layer. The undoped film 16 is formed from $In_xGa_yAl_zN$ and via an epitaxial process, wherein $x+y+z=1$, and $0 \leq x,y,z \leq 1$. Finally, a layer, which consists of a transparent conductive oxide, is formed and overlays the undoped film, so as to complete the semiconductor light emitting device.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
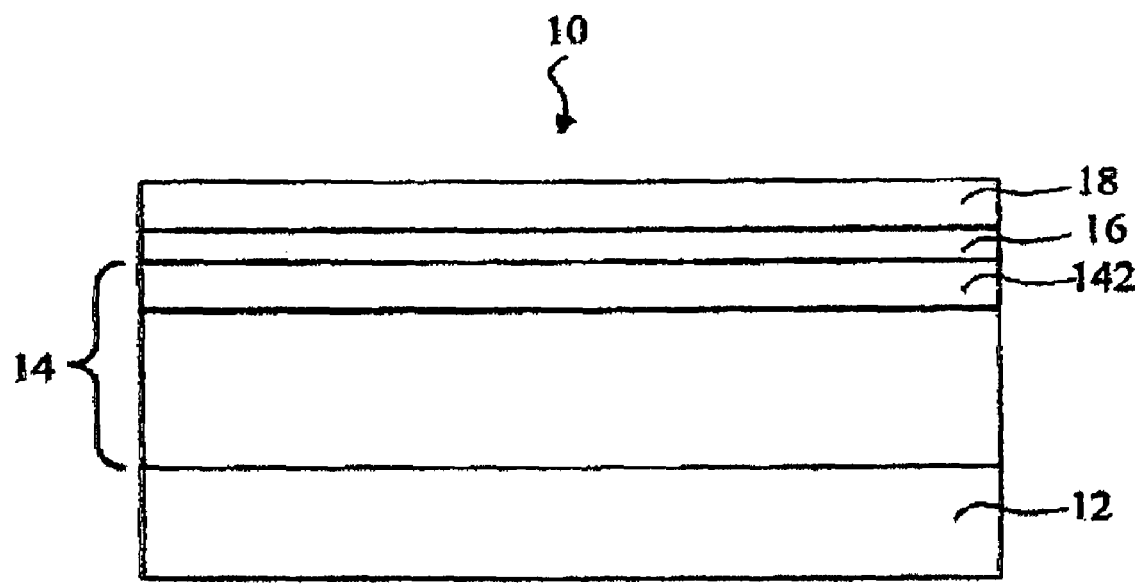
FIG. 1 is a sectional view of a semiconductor light emitting device according to the present invention.

According to one preferred embodiment, a semiconductor light emitting device 10 of the present invention is disclosed in FIG. 1, FIG. 1 is a sectional view of the semiconductor light emitting device 10.

As shown in FIG. 1, the semiconductor light emitting device 10 comprises a semiconductor substrate 12, a multi-layer structure 14 formed on the semiconductor substrate 12, an undoped film 16 overlaying the multi-layer structure 14, and a transparent conductive oxide layer 18.

Especially, the multi-layer structure comprises a light emitting region, e.g., a PN-junction, a double hetero-junction, or a multiple quantum well.

Especially, the undoped film 16 is formed from $In_xGa_yAl_zN$, wherein $x+y+z=1$, and $0 \leq x,y,z \leq 1$. In one embodiment, the undoped film 16 is formed by an epitaxial process, and a thickness of the undoped film 16 is less than or equal to 20 Angstroms.

As shown in FIG. 1, the multi-layer structure 14 comprises a top semiconductor material layer 142. The top semiconductor material layer 142 contacts the undoped film 16. In one embodiment, the top semiconductor material layer 142 is formed from a material selected from the group consisting material like GaN, AlGaN, InGaN, InGaAlN, and the like. The material being used to form the top semiconductor material layer 142 must match the multi-layer structure 14.

In one embodiment, the transparent conductive oxide layer 18 is formed from a material selected from the group consisting of ITO, ZnO, InO, ZrO, and the like.

Figure 2A:
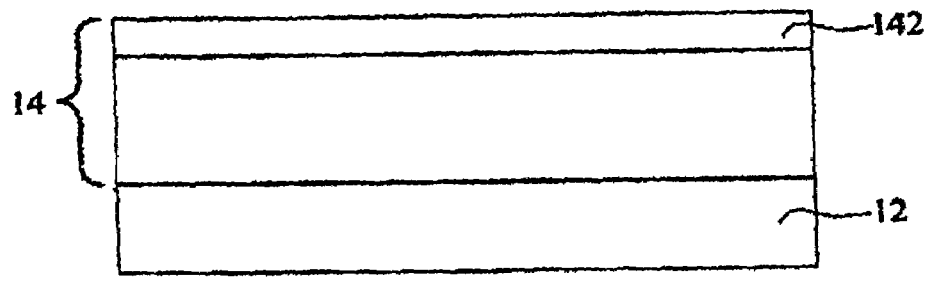
FIGS. 2A through 2C are the sectional views of a method for manufacturing the semiconductor light emitting device according to the present invention.
Figure 2B:
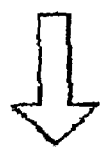
Figure 2B:
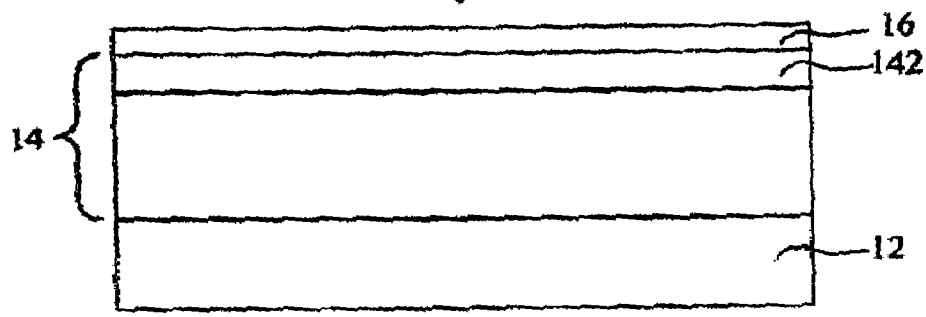
Figure 2C:
Figure 2C:
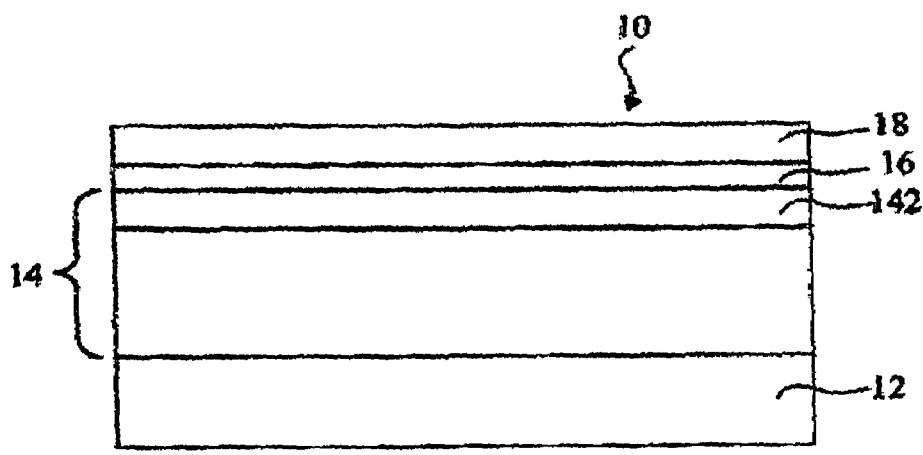

The method for manufacturing the semiconductor light emitting device 10 shown in FIG. 1 is disclosed in FIGS. 2A through 2C. FIGS. 2A through 2C are sectional views of mid-process results and final products during the manufacturing process.

First, as shown in FIG. 2A, the multi-layer structure 14, consisting of multi-epitaxial layer sequentially, is formed on a semiconductor substrate 12. Especially, the multi-layer structure 14 comprises a light emitting region, e.g. a PN-junction, a double hetero-junction, or a multiple quantum well, As shown in FIG. 2A, the multi-layer structure 14 provides the top semiconductor material layer 142.

Then, as shown in FIG. 2B, the undoped film 16 is formed to overlay the top semiconductor material layer 142. Especially, the undoped film 16 is formed from $In_xGa_yAl_zN$ and via an epitaxial process, wherein $x+y+z=1$, and $0 \leq x,y,z \leq 1$. During the epitaxial process, the thickness of the undoped film 16 is less than or equal to 20 Angstroms.

Finally, as shown in FIG. 2C, the transparent conductive oxide layer 18 is formed to overlay the undoped film 16, so as to complete the semiconductor light emitting device 10.

In the present invention, the undoped film 16 of $In_xGa_yAl_zN$ is used as a contact layer. If the material used to form the top semiconductor material layer 142 is a nitride semiconductor material, the undoped film 16 further forms a good ohm contact between the nitride semiconductor material 142 and the transparent conductive oxide layer 18. In this embodiment, the material being used to form the transparent conductive oxide layer can be selected from the group consisting of ITO, ZnO, InO, ZrO, or other transparent conductive oxide, of which the work function is more than 3.6 eV, or the electrophilic energy level is higher than $In_xGa_yAl_zN$.

Figure 3:
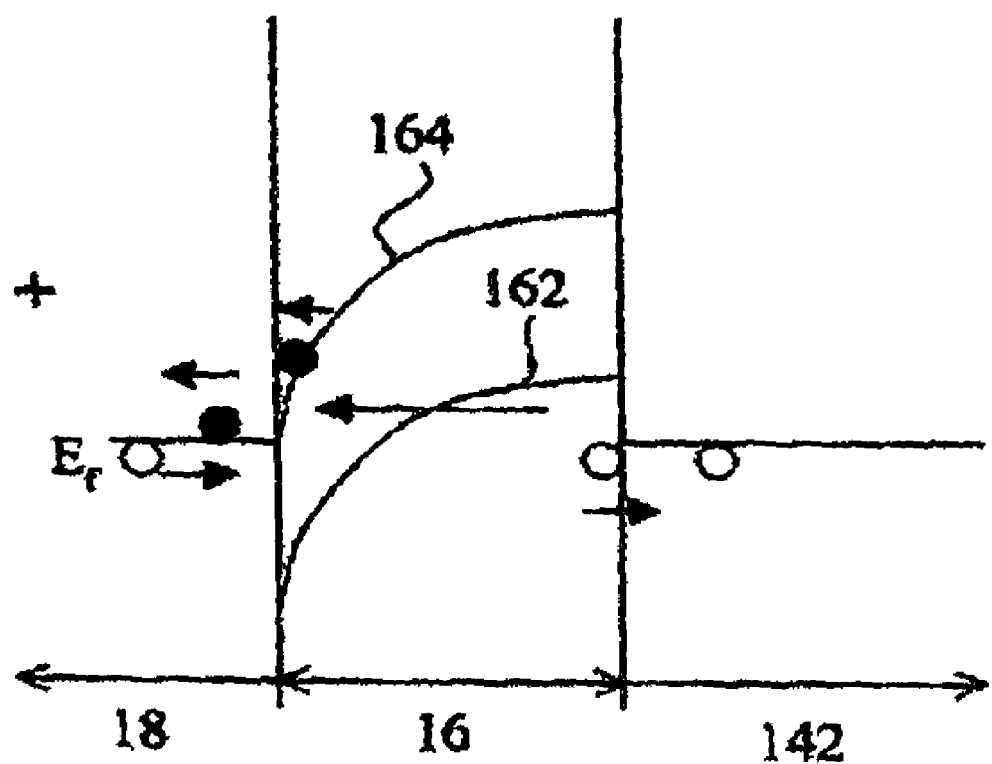
FIG. 3 is a schematic diagram of the electron tunneling from the valence electronic band to the conductive band within the undoped film of $In_xGa_yAl_zN$, which is used as the tunneling layer.

In the present invention, the undoped film 16 of $In_xGa_yAl_zN$ is also used as a tunneling layer. As shown in FIG. 3, because the undoped film 16 used as the tunneling layer is very thin ($\leq 20$ Angstromns), the electric field across the tunneling layer 16, under the forward bias voltage, enables the electron to tunnel from the valence electron band 162 to the conductive band 164, so as to come back to the transparent conductive oxide layer 18. The definition of $E_f$ in FIG. 3 is Fermi's energy. Moreover, because the semiconductor light emitting device of the present invention does not have implicit additional energy-barrier and reverse energy-barrier, the forward voltage of the semiconductor light emitting device of the present invention is lower. The forward voltage is determined by the following equation:

$$V_t = EXP\left(\frac{-4(2m^* \cdot E_g^3)^{3/2}}{3e \cdot \hbar \cdot E}\right),$$

wherein m* is the effective electron or hole mass, Eg is the effective band-gap of the undoped film, e is an electron charge, $\hbar$ is the Plank's constant, and E is the electric field across the undoped film.

Table 1 lists several practical cases and the forward voltages thereof and the luminance. Obviously, the forward voltages of the cases listed in table 1 are acceptable low voltages (3.3V~3.7V), and the luminance of the semiconductor light emitting device is high. Furthermore, from the technological viewpoint, according to the present invention, the undoped film used as the ohmic layer is suitable for overlaying the transparent conductive oxide layer of other semiconductor light emitting devices (not mentioned in this spec.).

TABLE 1

| TCOL's material | Ohmic layer's material (undoped) | semiconductor material of the top-most layer | material of active layer (light emitting region) | Vf (Volts) | luminance (mcd.) |
|---|---|---|---|---|---|
| ITO | $In_xGa_yAl_zN$ | P-type GaN | InGaN | 3.3 | 800 |
| ZnO | $In_xGa_yAl_zN$ | P-type GaN | InGaN | 3.7 | 650 |
| InO | $In_xGa_yAl_zN$ | P-type GaN | InGaN | 3.5 | 710 |
| ZrO | $In_xGa_yAl_zN$ | P-type GaN | InGaN | 3.6 | 690 |

Obviously, the undoped film does not dope the carrier of P-type, N-type, or common doped type. Therefore, during the operation of the semiconductor light emitting device according to the present invention, the carrier does not diffuse. Accordingly, the forward voltage of the semiconductor light emitting device of the present invention is steady during operation.

The features and advantages of the present invention are summarized as follows:

(a) A thinner undoped film of $In_xGa_yAl_zN$ is formed between the top semiconductor material layer and the transparent conductive oxide layer, so as to form a good ohm contact between the top semiconductor material layer and the transparent conductive oxide layer;

(b) The undoped film of $In_xGa_yAl_zN$ is used as the tunneling layer, in which the thickness is controlled to enable the forward voltage of the semiconductor light emitting device to achieve acceptable low voltage; and (c) Because of the undoped film, during the operation of the semiconductor light emitting device according to the present invention, the carrier does not diffuse; because of that, the forward voltage of the semiconductor light emitting device of the present invention is steady during operation.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light emitting device, comprising:

a semiconductor substrate;

a multi-layer structure formed on the semiconductor substrate, the multi-layer structure comprising a light emitting region;

an undoped film of $In_xGa_yAl_zN$ overlaying the multi-layer structure, wherein x+y+z=1, and $0 \leq x,y,z \leq 1$; and a layer, consisting of a transparent conductive oxide, overlaying the undoped film;

wherein an operating forward voltage of said semiconductor light emitting device is determined by the following formula:

$$V_t = \mathrm{EXP}\left(\frac{-4(2m^* \cdot E_g^3)^{3/2}}{3e \cdot \hbar \cdot E}\right),$$

$m^*$ is the effective electron or hole mass, $E_g$ is the effective band-gap of the undoped film, e is an electron charge, $\hbar$ is the Plank's constant, and E is the electric field across the undoped film.

2. The semiconductor light emitting device of claim 1, wherein the undoped film is formed by an epitaxial process, and a thickness of the undoped film is less than or equal to 20 Angstroms.

3. The semiconductor light emitting device of claim 1, wherein the operating forward voltage is less than or equal to 3.7 Volts.

4. The semiconductor light emitting device of claim 1, wherein the transparent conductive oxide is one selected from the group consisting of ITO, ZnO, InO and ZrO.

5. The semiconductor light emitting device of claim 1, wherein the light emitting region comprises one selected from the group consisting of a PN-junction, a double heterojunction and a multiple quantum well.

6. The semiconductor light emitting device of claim 1, wherein the multi-layer structure comprises a layer contacting the undoped film and formed from a matertal selected from the group consisting of GaN, AlGaN, InGaN and InGaAlN.

* * * * *

UNITED STATES PATENT AND TRADEMARK OFFICE
CERTIFICATE OF CORRECTION

PATENT NO.         : 7,141,830 B2                                                Page 1 of 1
APPLICATION NO.    : 10/942697
DATED              : November 28, 2006
INVENTOR(S)        : Huang et al.

It is certified that error appears in the above-identified patent and that said Letters Patent is hereby corrected as shown below:

Title Page, Item (73) Assignee please remove "Mediatek, Incorporated" and insert --Epistar Corporation--

Signed and Sealed this

Fifteenth Day of December, 2009

David J. Kappos
*Director of the United States Patent and Trademark Office*